(12) United States Patent
Park et al.

(10) Patent No.: US 6,492,200 B1
(45) Date of Patent: Dec. 10, 2002

(54) SEMICONDUCTOR CHIP PACKAGE AND FABRICATION METHOD THEREOF

(75) Inventors: Ik Seong Park, Cheongju (KR); In Soo Kang, Cheongju (KR)

(73) Assignee: Hyundai Electronics Industries Co., Inc., Ichon (KR)

( * ) Notice: Subject to any disclaimer, the term of this patent is extended or adjusted under 35 U.S.C. 154(b) by 0 days.

(21) Appl. No.: 09/317,137

(22) Filed: May 24, 1999

(30) Foreign Application Priority Data

Jun. 12, 1998 (KR) .............................. 98/21939

(51) Int. Cl.⁷ .............................................. H01L 21/44
(52) U.S. Cl. ...................... 438/113; 438/118; 438/612; 438/613; 257/690; 257/700; 257/773
(58) Field of Search ................................ 438/111, 112, 438/118, 612, 613, 618, 113; 257/780, 781, 773, 690, 700, 778

(56) References Cited

U.S. PATENT DOCUMENTS 5,563,102 A  * 10/1996  Michael ....................... 438/614
5,683,942 A  * 11/1997  Kata et al. ................... 438/118
5,744,382 A  *  4/1998  Kitayama et al. ........... 438/613
5,793,118 A  *  8/1998  Nakajima .................... 257/706
5,851,911 A  * 12/1998  Farnworth .................... 438/614
5,863,812 A  *  1/1999  Manteghi .................... 438/118
5,866,949 A     2/1999  Schueller ..................... 257/778
5,897,337 A  *  4/1999  Kata et al. ................... 438/613

* cited by examiner

*Primary Examiner*—Kevin M. Picardat
(74) *Attorney, Agent, or Firm*—Fleshner & Kim, LLP

(57) ABSTRACT

A semiconductor chip package and a fabrication method thereof can reduce fabrication time and cost by consecutively fabricating a semiconductor chip to the package at a wafer level. The method for fabricating the semiconductor chip package includes a step of forming the semiconductor chip having a plurality of pads at its upper portion on a wafer, a step of forming a low elastic modulus material layer 22, such as a silicone on the wafer except the pads by a spin coating process or a sputtering process, a step of forming metal patterns on the pads and the low elastic modulus material layer by a metal thin film deposition process or a photo lithography process, a step of forming a high elastic modulus material layer on the metal patterns and the low elastic modulus material layer, a step of partially exposing the upper portions of the metal patterns, and a step of boding electric media to the exposed metal patterns.

37 Claims, 11 Drawing Sheets

SEMICONDUCTOR CHIP PACKAGE AND FABRICATION METHOD THEREOF

BACKGROUND OF THE INVENTION

1. Field of the Invention

The present invention relates to a semiconductor chip package, and in particular to a semiconductor chip package and a fabrication method thereof which can consecutively fabricate a semiconductor chip to the package.

2. Description of the Background Art

Many companies have made every effort to fabricate a highly-integrated pin package. There is exemplified a BGA-type semiconductor package using a plurality of solder balls bonded to a substrate as outer terminals. Here, the BGA-type semiconductor chip package is fabricated by positioning the plurality of solder balls at an upper or lower surface of the substrate, and by bonding the solder balls at a time with a heat from a furnace, and thus productivity is improved. In addition, the outer terminals are ball-shaped, and thus are not easily deformed due to an external shock.

The constitution of the conventional BGA-type semiconductor chip package will now be explained with reference to the accompanying drawings.

Referring to FIG. 1, an elastomer 2 is bonded to an upper center portion of a semiconductor chip 1. An adhesive resin 3 is formed on the elastomer 2. A plurality of conductive metal traces 4a transmitting an electric signal between our terminals and semiconductor chip pads are bonded to the adhesive resin 3. Each one end portion of the conductive metal traces 4a is connected to a metal lead 4b. The metal lead 4b is connected to a pad 6 formed at an upper edge portion of the semiconductor chip 1. A solder resist 5 is spread at the portion of the conductive metal trace 4a where a conductive ball is not bonded, and an upper portion of the adhesive resin 3. An encapsulant 7 covers the metal leads 4b and the upper portion of the semiconductor chip 1 which the solder resist 5 is not spread. The conductive ball 8 is formed on the conductive metal trace 4a, and serves as an outer terminal.

A method of fabricating the conventional BGA-type semiconductor package as depicted in FIG. 1 will now be described.

Firstly, a plurality of semiconductor chips are formed on a wafer in accordance with a general method of fabricating a semiconductor device. Polyimide or benzocyclo butene (BCB) is spread at the upper portions of the semiconductor chips as a passivation film. Thereafter, pads of the semiconductor chips are exposed. A dicing process for respectively cutting the plurality of semiconductor chips on a wafer is carried out. An elastomer is bonded to an upper portion of a polyimide tape. An adhesive is formed at the upper and lower surfaces of the elastomer, and a plurality of metal patterns are formed at the lower surface of the polyimide tape. A die attach process is performed for bonding the elastomer to the upper surface of the semiconductor chips. The upper surface where the pads are formed. A metal lead is connected at the end portion of the metal pattern. In addition, the plurality of metal patterns are mostly covered with a solder resist, and partially exposed. A solder ball is mounted at the exposed portion of the metal pattern.

Thereafter, a resultant structure of the die attach process is turned over.

Then, a lead bonding process is performed thereon for bonding one end portion of the metal lead to the pad of the semiconductor chip. An encapsulation process is carried out in order to cover the metal lead and the upper portion of the pad of the semiconductor chip.

Then, a solder ball mounting process is performed for mounting the solder ball at the upper portion of the metal patterns (exposed portions which are not spread with the solder resist) formed at the polyimide tape. A reflow process of the solder ball is carried out for bonding the solder balls to the metal patterns. Thus, the fabrication of the conventional BGA-type semiconductor chip package is completed.

However, the BGA-type semiconductor package as shown in FIG. 1 has many disadvantages in that the fabrication method is complicated and includes many process steps, the fabrication time of the package is long, and the fabrication cost is high. That is, after the process of forming the semiconductor device is carried out, the process of respectively separating the chips by cutting the wafer, the die attach process, the bonding process of the metal lead and the solder ball mounting process are performed.

In addition, each process requires different package fabrication equipment, which results in increased cost.

In accordance with the conventional semiconductor chip package process, after the semiconductor chips are each respectively cut, and thus the chips are assembled to package one by one. As a result, a process time becomes longer, and productivity is decreased.

Also, it is necessary to prepare for the film-type elastomer and the polyimide tape having its one side provided with the metal patterns, thereby increasing the raw material cost. Therefore, the package cost is also increased.

In general, an FR-4 is used for a material of a printed circuit board where the semiconductor chip and a silicon substrate is used for the semiconductor chip material. The FR-4 and the silicon has a high elastic modulus and there is big difference in thermal expansion coefficient between the FR-4 and the silicon substrate. In addition, a polyimide layer having a high elastic modulus is employed as the passivation film to be formed at the upper surface of the conventional semiconductor chip. Accordingly, when the semiconductor chip is mounted on the printed circuit board, the polyimide layer cannot absorb a stress generated due to the big difference in the thermal expansion coefficient between the printed circuit board and the semiconductor chip. As a result, the stress is applied to a solder between the outer lead and the printed circuit board, thus decreasing a life span of the semiconductor package.

SUMMARY OF THE INVENTION

It is therefore a primary object of the present invention to provide a semiconductor chip package and a fabrication method thereof which can reduce a package fabrication time by consecutively fabricating a semiconductor chip to the semiconductor package at a wafer level.

It is another object of the present invention to provide a semiconductor chip package and a fabrication method thereof which can reduce a fabrication cost because the package is fabricated by equipment used for fabricating a semiconductor chip and an additional cost of equipment for the package is not incurred.

It is still another object of the present invention to provide a semiconductor chip package and a fabrication method thereof which can improve reliability by employing a silicone having a relatively lower elastic modulus than a polyimide layer as a passivation film for a semiconductor chip, in order to absorb a stress generated due to a big difference in thermal expansion coefficient between the semiconductor chip and a printed circuit board.

It is still another object of the present invention to provide a semiconductor chip package and a fabrication method thereof which can improve reliability by spreading a material having a relatively high elastic modulus on a silicone which is a low elastic modulus material, and on the metal patterns formed on the silicone, in order to absorb a stress applied to the metal patterns.

In order to achieve the above-described objects of the present invention, there is provided a semiconductor chip package including: a semiconductor chip, a plurality of pads being formed at its upper portion; a low elastic modulus material layer covering the semiconductor chip except the pads, and having a relatively low elastic modulus; a plurality of metal patterns connected with at least one pad, and formed on the low elastic modulus material layer; a high elastic modulus material layer covering the metal patterns and the low elastic modulus material layer, having an opening portion for at least partially exposing the metal patterns, and having a relatively higher elastic modulus than the low elastic modulus material layer; and electric media bonded to the upper portions of the exposed metal patterns.

In order to achieve the above-described objects of the present invention, there is provided a semiconductor chip package wherein an elastic modulus of the low elastic modulus material layer is smaller than 400 MPa.

In order to achieve the above-described objects of the present invention, there is provided a semiconductor chip package wherein the elastic modulus of the low elastic modulus material layer is set especially between 3.5 MPa and 300 MPa.

In order to achieve the above-described objects of the present invention, there is provided a semiconductor chip package wherein a material of the low elastic modulus material layer is a silicone.

In order to achieve the above-described objects of the present invention, there is provided a semiconductor chip package wherein an elastic modulus of the high elastic modulus material layer is set between 1000 MPa and 8000 MPa.

In order to achieve the above-described objects of the present invention, there is provided a semiconductor chip package wherein the high elastic modulus material layer has a lower elastic modulus than a printed circuit board.

In order to achieve the above-described objects of the present invention, there is provided a semiconductor chip package wherein the high elastic modulus material layer consists of polyimide or benzocyclo butene.

In order to achieve the above-described objects of the present invention, there is provided a semiconductor chip package wherein the electric media are conductive balls.

In order to achieve the above-described objects of the present invention, there is provided a semiconductor chip package including: a semiconductor chip, a plurality of pads being formed at its upper portion; a low elastic modulus material layer covering the semiconductor chip except the pads, and having a relatively low elastic modulus; a high elastic modulus material layer formed at an upper portion of the low elastic modulus material layer, and having a higher elastic modulus than the low elastic modulus material layer; a plurality of metal patterns connected with at least one pad, and formed on the high elastic modulus material layer; and electric media bonded to the upper portions of the metal patterns.

In addition, in order to achieve the above-described objects of the present invention, there is provided a method for fabricating a semiconductor chip package including: a step of fabricating a plurality of semiconductor chips having a plurality of pads at their upper portions on a semiconductor wafer; a step of covering a low elastic modulus material layer having a relatively low elastic modulus on the semiconductor wafer; a step of exposing the pads by selectively etching the low elastic modulus material layer; a step of covering a metal film on the low elastic modulus material layer and the exposed pads; a step of forming a plurality of metal patterns on the pads and the low elastic modulus material layer by selectively etching the metal film; a step of forming a high elastic modulus material layer having a relatively high elastic modulus on the metal patterns and the low elastic modulus material layer; a step of exposing the upper portions of the metal patterns by selectively etching the high elastic modulus material layer; a step of bonding electric media to the upper portions of the exposed metal patterns; and a step of respectively cutting the semiconductor chips on the semiconductor wafer.

In order to achieve the above-described objects of the present invention, there is provided a method for fabricating a semiconductor chip package wherein a material of the low elastic modulus material layer is a silicone.

In order to achieve the above-described objects of the present invention, there is provided a method for fabricating a semiconductor chip package wherein the high elastic modulus material layer consists of polyimide or benzocyclo butene.

In order to achieve the above-described objects of the present invention, there is provided a method for fabricating a semiconductor chip package wherein the electric media are conductive balls.

In order to achieve the above-described objects of the present invention, there is provided a method for fabricating a semiconductor chip package including: a step of fabricating a plurality of semiconductor chips having a plurality of pads at their upper portions on a semiconductor wafer; a step of covering a low elastic modulus material layer having a relatively low elastic modulus on the semiconductor wafer; a step of covering a high elastic modulus material layer having a relatively high elastic modulus on the low elastic modulus material layer; a step of exposing the pads by selectively etching the high and low elastic modulus material layers; a step of covering a metal film on the high elastic modulus material layer and the exposed pads; a step of forming a plurality of metal patterns on the pads and the high elastic modulus material layer by selectively etching the metal film; a step of bonding electric media to the upper portions of the metal patterns; and a step of respectively cutting the semiconductor chips on the semiconductor wafer.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE INVENTION

Figure 1:
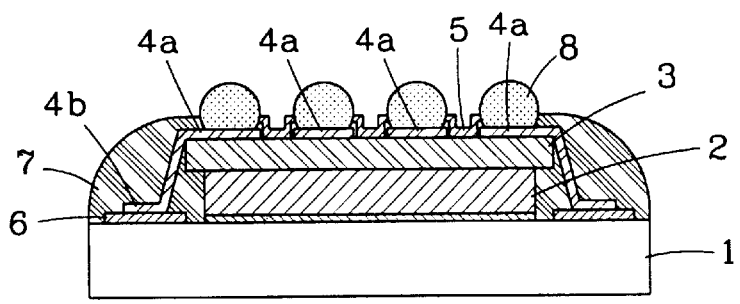
FIG. 1 is a cross-sectional view illustrating a conventional semiconductor chip package.
Figure 2:
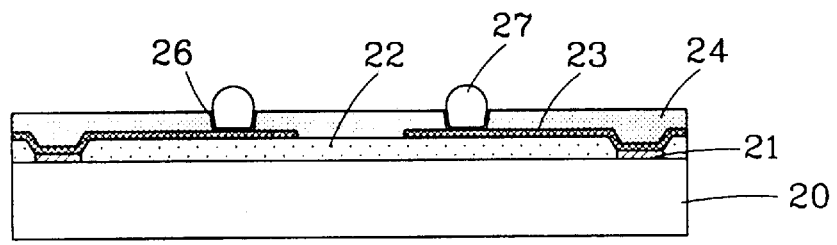
FIG. 2 is a cross-sectional view illustrating a semiconductor chip package in accordance with a first embodiment of the present invention.

The constitution of a semiconductor chip package in accordance with the present invention will now be explained with reference to the accompanying drawings. FIG. 2 is a cross-sectional view illustrating a semiconductor chip package in accordance with a first embodiment of the present invention.

Referring to FIG. 2, a semiconductor chip 20 has a plurality of pads 21 at its upper surface. A low elastic modulus material layer 22 having a sufficiently lower elastic modulus than silicon which is a material of the semiconductor chip 20 or polyimide which is generally used as a passivation film of a conventional semiconductor chip is positioned at the upper surface of the semiconductor chip 20 except the pads 21. According to the present invention, the low elastic modulus material layer 22 consists of a silicone having an elastic modulus between 3.5 MPa and 300 MPa. Although the silicone is employed as the low elastic modulus material layer 22 according to the present invention, an insulation material having an elastic modulus equal to or smaller than 400 MPa may be used.

In addition, a plurality of metal patterns 23 are formed at the upper portion of the low elastic modulus material layer 22. The plurality of metal patterns 23 are extended to the upper portions of the pads 21, connected directly to an outer lead, namely a conductive ball 27, and serve as the pad 22. In the conventional semiconductor chip package, the lead is directly bonded to the upper portion of the pad, but such constitution has limitations in design of the semiconductor chip. Accordingly, in order to freely design the semiconductor chip, the pads are optionally positioned on the semiconductor chip. An insulation layer is formed on the semiconductor chip, and the metal patterns connected to the pads are formed on the insulation layer. Thereafter, the pads are re-positioned at a point which can be easily connected with the lead. The metal patterns 23 are formed for repositioning of the pads.

A high elastic modulus material layer 24 having a high elastic modulus is formed on the metal patterns 23 and the low elastic modulus material layer 22. An elastic modulus of the high elastic modulus material layer 24 is determined between 1000 MPa and 8000 MPa. It is advantageous that elasticity of the high elastic modulus material layer 24 is higher than that of the low elastic modulus material layer 22 and lower than that of a printed circuit board. Identically to the conventional art, polyimide or benzocyclo butene (BCB) is employed as a protective film for the semiconductor chip. The high elastic modulus material layer 24 includes a plurality of opening portions for exposing predetermined portions of the metal patterns 23. A metal thin film 26 is formed at the upper portions of the metal patterns 23 exposed by the opening portions. The metal thin film 26 consists of a multi-layer metal film, such as copper/titanium/copper and copper/nickel/aluminum. A conductive ball 27 is formed on the metal thin film 26. The conductive ball is equivalent to the outer lead, and thus there can be employed different conductive media having electric conductivity, such as a spring lead, a bump and the like.

As described above, in accordance with the first embodiment of the present invention, the low elastic modulus material layer 22 is formed on the semiconductor chip 20, the plurality of metal patterns 23 for re-positioning of the pads 21 are formed on the low elastic modulus material layer 22, and the high elastic modulus material layer 24 is formed on the metal patterns 23 and the low elastic modulus material layer 22. The operation of the high and low elastic modulus material layers according to the present invention will now be described.

When the completed semiconductor package is mounted on the printed circuit board, the outer lead is fixed to wires of the printed circuit board by a solder. Here, there is a big difference in thermal expansion coefficient between the semiconductor chip material and the printed circuit board material, thereby applying a considerable stress to the solder. For reference, an elastic modulus of a silicon single crystal which is a material of the semiconductor chip is 184,000 MPa, and its thermal expansion coefficient is 2.8, approximately.

On the other hand, a material of the printed circuit board is FR-4 (glass fiber reinforced material of an epoxy group), and has an elastic modulus of approximately 10,300 MPa with a thermal expansion coefficient between 17 and 20. The materials of the semiconductor chip and the printed circuit board have a remarkably high elastic modulus, and thus cannot absorb the stress generated due to the difference in thermal expansion coefficient. Accordingly, the stress is applied to a solder connecting the outer lead of the semiconductor chip and the printed circuit board, thereby decreasing a life span of the semiconductor chip package and reducing reliability thereof. According to the present invention, the silicone which is a soft material having an elastic modulus of approximately 3.5 MPa to 60 MPa is coated on the semiconductor chip in order to absorb the stress between the semiconductor chip and the printed circuit board. In addition, the high elastic modulus material layer having a relatively higher elastic modulus than the low elastic modulus material layer is formed on the metal patterns, and thus protects the metal patterns from an external shock. The stress applied from the soft silicone to the metal patterns positioned thereon is partially distributed, thereby reducing the stress applied to the metal patterns. However, it is preferable that the elastic modulus of the high elastic modulus material layer is lower than that of the printed circuit board.

Figure 3:
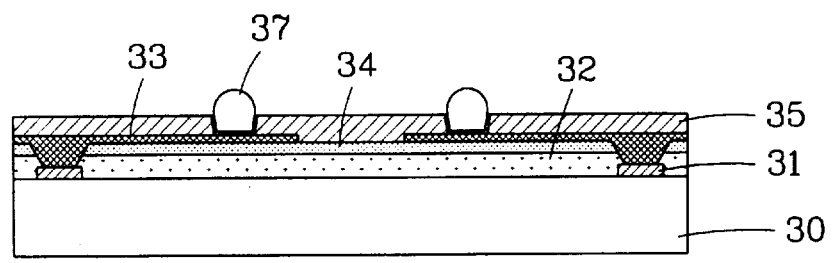
FIG. 3 is a cross-sectional view illustrating a semiconductor chip package in accordance with a second embodiment of the present invention.

FIG. 3 is a vertical-sectional view illustrating a semiconductor chip package in accordance with a second embodiment of the present invention.

Referring to FIG. 3, a semiconductor chip 30 has a plurality of pads 31 at its upper portion. A low elastic modulus material layer 32 is formed at the upper portion of the semiconductor chip 30 except the pads 31. A high elastic modulus material layer 34 is formed on the low elastic modulus material layer 32. Here, the materials of the high and low elastic modulus material layers are identical to the first embodiment of the present invention. A plurality of metal patterns 33 are formed on the high elastic modulus material layer 34, covering the upper portions of the pads 31. The metal patterns 33 are covered with a solder resist film 35. A plurality of opening portions are formed at the solder resist film 35 in order to expose the upper portions of the metal patterns 33. A conductive ball 37 is connected to the metal pattern 33 through the opening portion. The conductive ball is equivalent to the outer lead, and thus different conductive media having electric conductivity, such as a spring lead and bump may be employed.

In accordance with the second embodiment of the present invention, the metal patterns are formed on the high elastic modulus material layer, differently from the first embodiment. Therefore, the low elastic modulus material layer and the high elastic modulus material layer are formed between the metal patterns and the semiconductor chip, and thus the conductive balls on the metal patterns are positioned far from the semiconductor chip. As a result, capacitance between the semiconductor chip and the conductive balls is reduced, thereby improving electric reliability of the semiconductor chip package.

A method for fabricating the semiconductor chip package in accordance with the first embodiment of the present invention will now be explained with reference to FIGS. 4a to 4j.

Figure 4A:
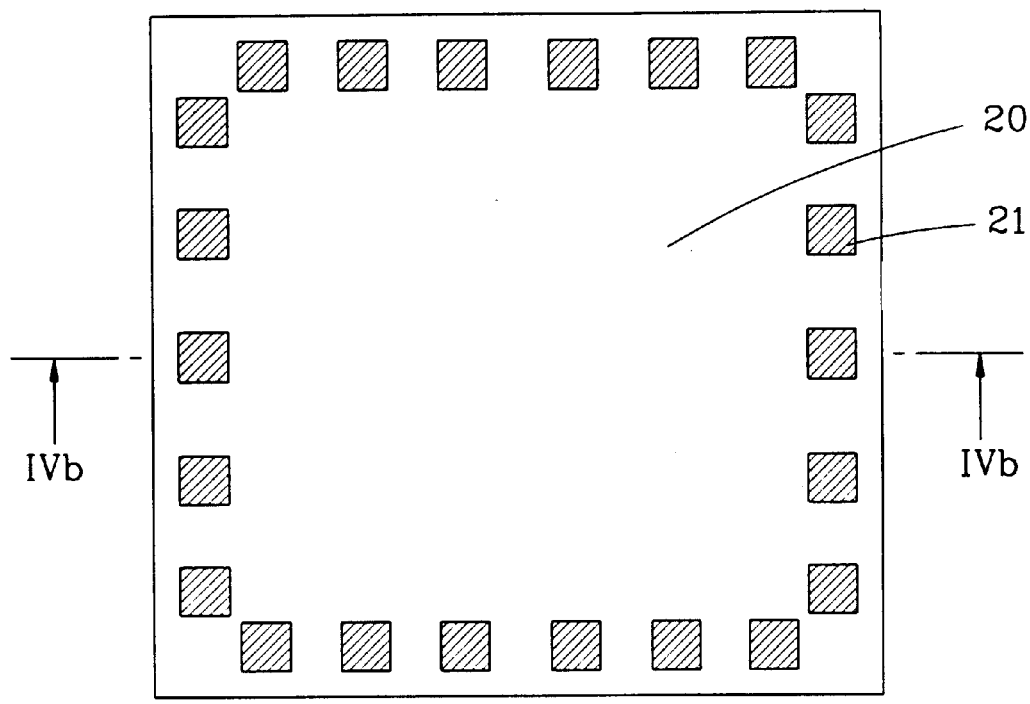
FIGS. 4a to 4j are process views illustrating sequential steps of a method for fabricating the semiconductor chip package in accordance with the first embodiment of the present invention.

As shown in FIG. 4a, the plurality of semiconductor chips 20 having the plurality of pads 21 at their upper portions are fabricated on the semiconductor wafer by the conventional fabrication method of the semiconductor chip. FIG. 4a illustrates one of the semiconductor chips 20 formed on the semiconductor wafer. However, the semiconductor chip 20 as shown in FIG. 4a is formed in a multiple number on the wafer (or semiconductor substrate).

Figure 4B:
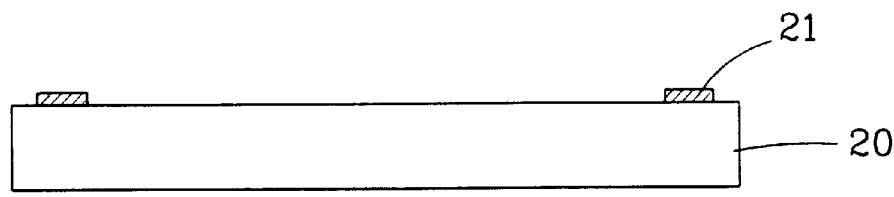

FIG. 4b is a vertical-sectional view taken along Line IVb—IVb in FIG. 4a. Reference numerals identical to FIG. 4a depict identical units.

Thereafter, the low elastic modulus material layer 22 having a relatively low elastic modulus is spread on the entire upper portion of the semiconductor chip 20 as shown in FIG. 4a at a thickness of 15 to 70 $\mu$m. For example, the silicone may be used as the material of the low elastic modulus material layer 22. It is economically advantageous to employ as a spreading method a spin coating process or a sputtering process generally used for a thin film formation process in the semiconductor chip fabrication process. An elastic modulus of the silicone is between 3.5 MPa and 60 MPa. In addition to the silicone, an insulation material having an elastic modulus equal to or smaller than 400 MPa may be used as the low elastic modulus material layer 22.

Figure 4C:
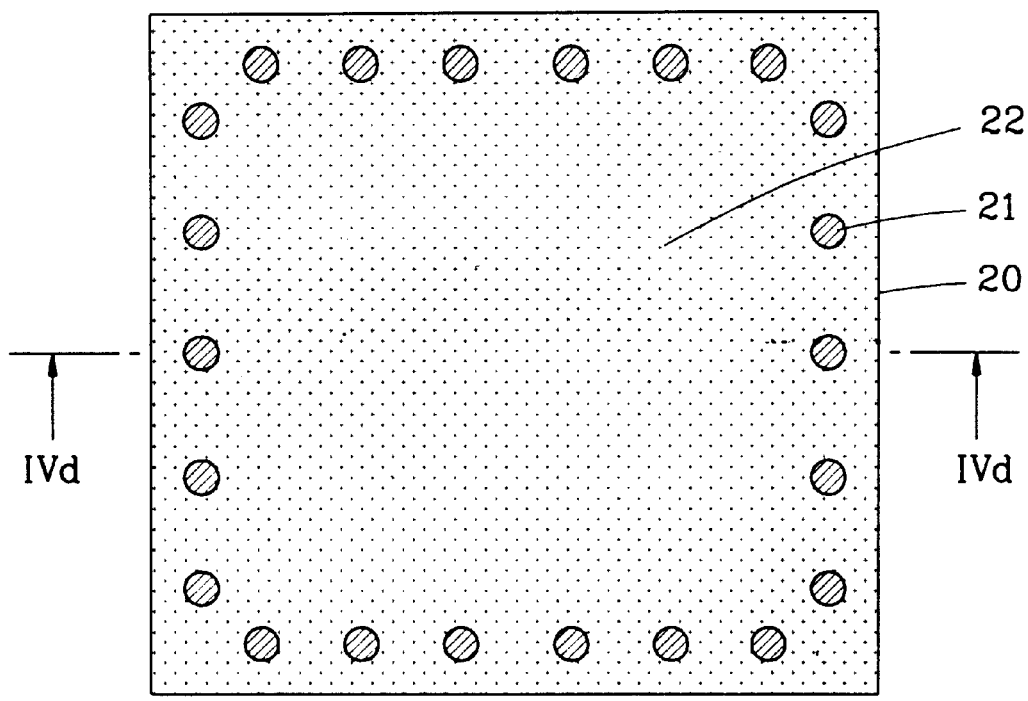

Then, a photoresist film is spread on the low elastic modulus material layer, and the pads 21 are exposed by selectively carrying out a photo lithography process and an etching process, thereby making a structure shown in FIG. 4c.

Figure 4D:
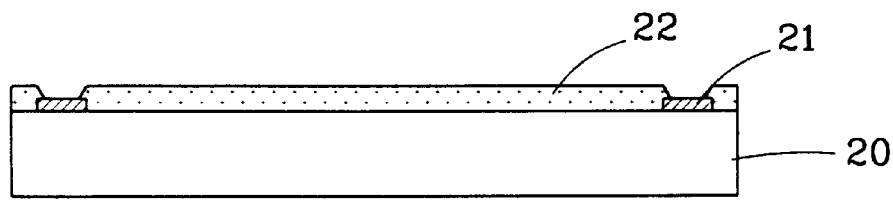

FIG. 4d is a vertical-sectional view taken along Line IVd—IVd in FIG. 4c. Reference numerals identical to FIG. 4c depict identical units.

Figure 4E:
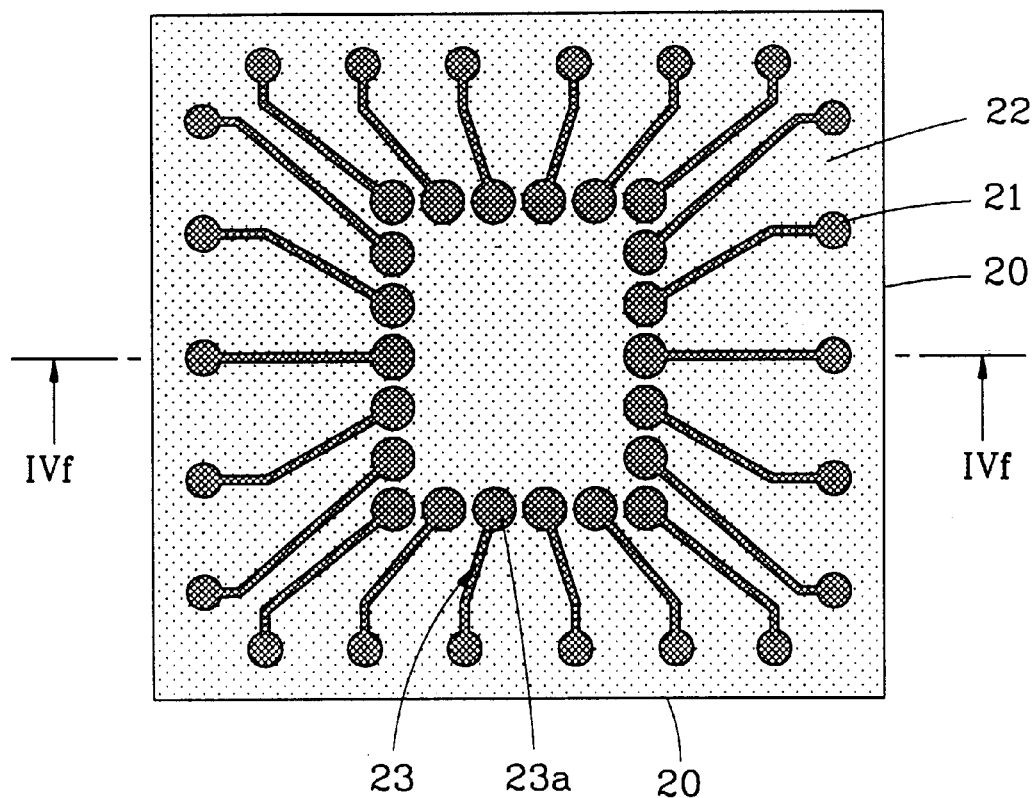
Figure 4F:
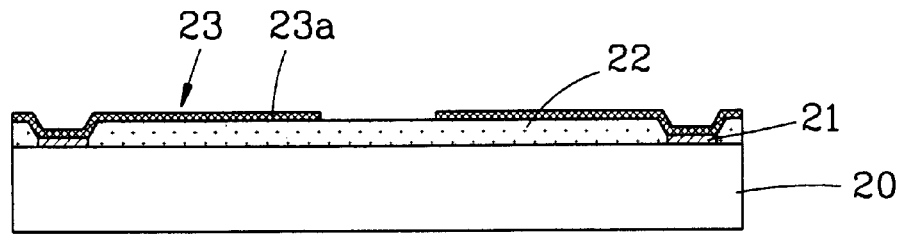

Referring to FIG. 4e, the metal patterns 23 are formed by forming the metal film on the entire structure of FIG. 4c and pattering it. The metal pattern 23 is directly connected to the outer lead, and thus serves as the pad. The conductive ball is bonded to the upper portion of the metal pattern 23. The position of the metal pattern 23 where the conductive ball is mounted is different from the position of the pad, and thus the metal pattern forming process is called a pad re-positioning process. Reference numeral 21 in FIGS. 4e and 4f depicts the original position of the pad, and reference numeral 23 depicts the position where the conductive ball or different outer lead serving as the pad is mounted. FIG. 4f is a vertical-sectional view taken along Line IVe—IVe in FIG. 4e. Reference numerals identical to FIG. 4e depict identical units.

Figure 4G:
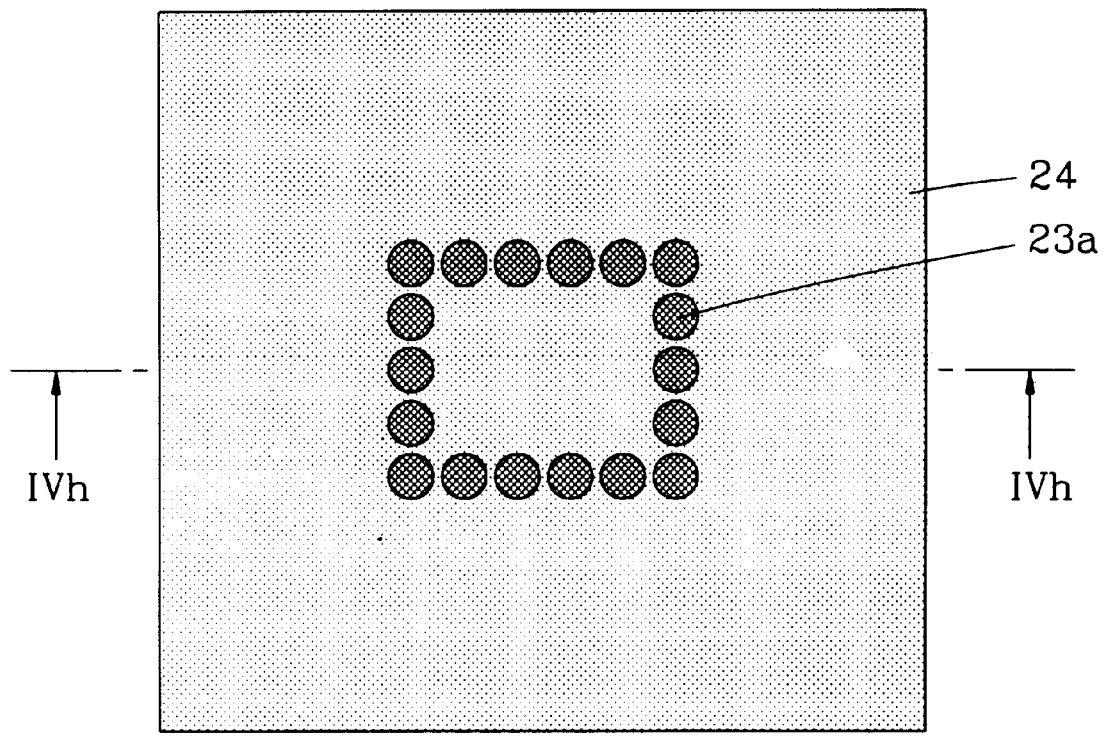

As shown in FIG. 4g, upper predetermined portions 23a of the metal patterns 23 are exposed by forming the high elastic modulus material layer 24 having an elastic modulus between 1000 MPa and 8000 MPa at a thickness of 5 to 25 $\mu$m on the entire structure of FIG. 4e. Reference numeral 23a in FIGS. 4e and 4f depicts the exposed upper portion of the metal pattern 23 serving as the pad.

Figure 4H:
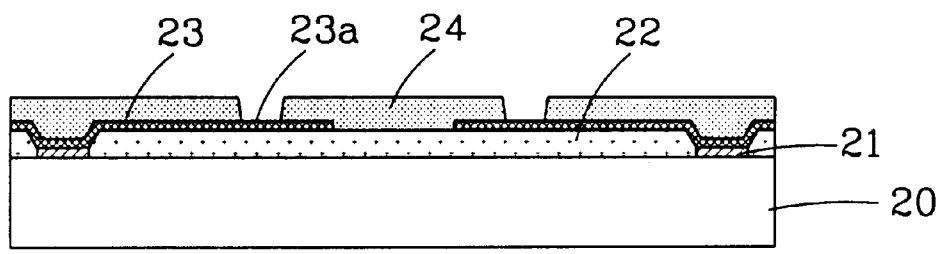

FIG. 4h is a vertical-sectional view taken along Line IVh—IVh in FIG. 4g. Reference numerals identical to FIG. 4g depict identical units.

Figure 4I:
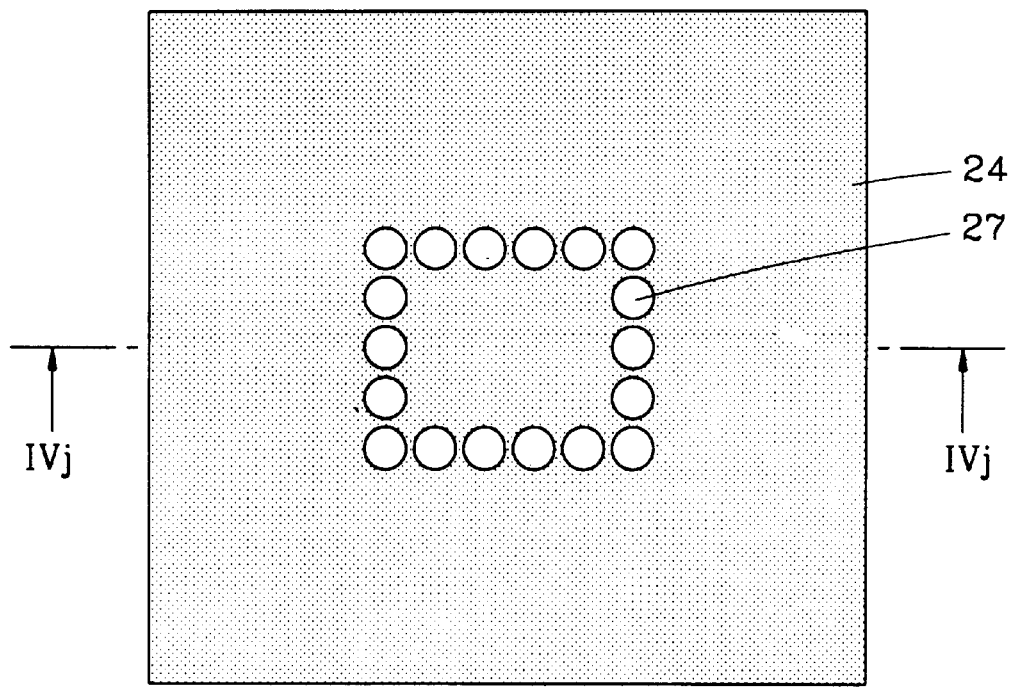

Referring to FIG. 4i, the conductive ball 27 is bonded to the exposed upper portion of the metal pattern 23. As a method of bonding the conductive balls 27, screen-printing and reflowing of the solder are carried out at the upper portion 23a of the metal pattern.

As the method of bonding the conductive ball 27, after the conductive ball, namely the solder ball is mounted at the upper portion 23a of the metal pattern, the reflowing of the solder ball can be carried out.

Figure 4J:
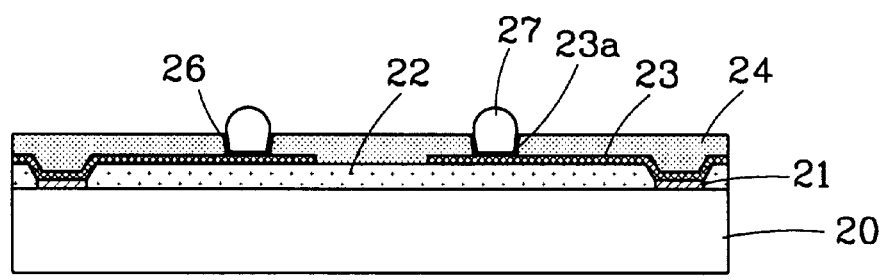

The conductive ball 27 is equivalent to the outer lead, and thus different conductive media having electric conductivity, such as a spring lead and a bump may be used. That is, the spring lead may be bonded to the upper portion 23a of the metal pattern, or the conductive material may be plated. FIG. 4j is a vertical-sectional view taken along Line IVj—IVj in FIG. 4i. Reference numerals identical to FIG. 4i depict identical units.

The fabrication process of the semiconductor chip package in accordance with the present invention as shown in FIGS. 4a to 4j is carried out at a wafer level. After the process of FIG. 4j is completed, the semiconductor chips on the wafer are respectively separated, thus completing the fabrication of the semiconductor chip package in accordance with the first embodiment of the present invention.

FIGS. 5a to 5j are process views illustrating sequential steps of a method for fabricating the semiconductor chip package in accordance with the second embodiment of the present invention.

Figure 5A:
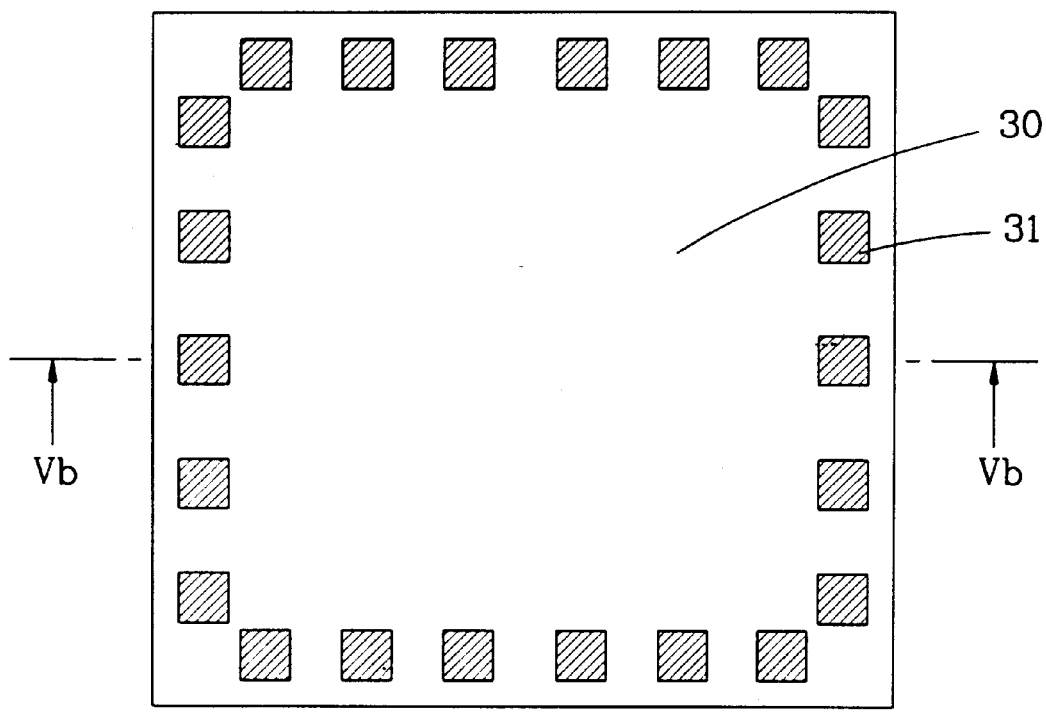
FIGS. 5a to 5j are process views illustrating sequential steps of a method for fabricating the semiconductor chip package in accordance with the second embodiment of the present invention.

Referring to FIG. 5a, the plurality of semiconductor chips 30 having the plurality of pads 31 at their upper portions are fabricated on the semiconductor wafer by the conventional fabrication method of the semiconductor chip. FIG. 5a illustrates one of the semiconductor chips 30 formed on the semiconductor wafer.

Figure 5B:
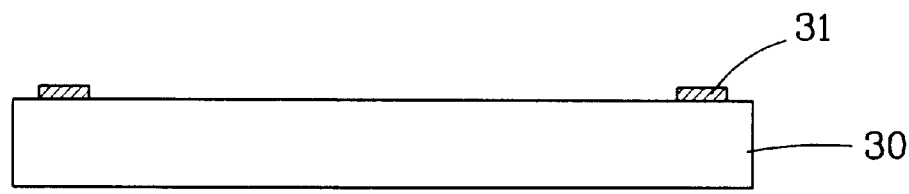

FIG. 5b is a vertical-sectional view taken along Line Vb—Vb in FIG. 5a. Reference numerals identical to FIG. 5a depict identical units.

Figure 5C:
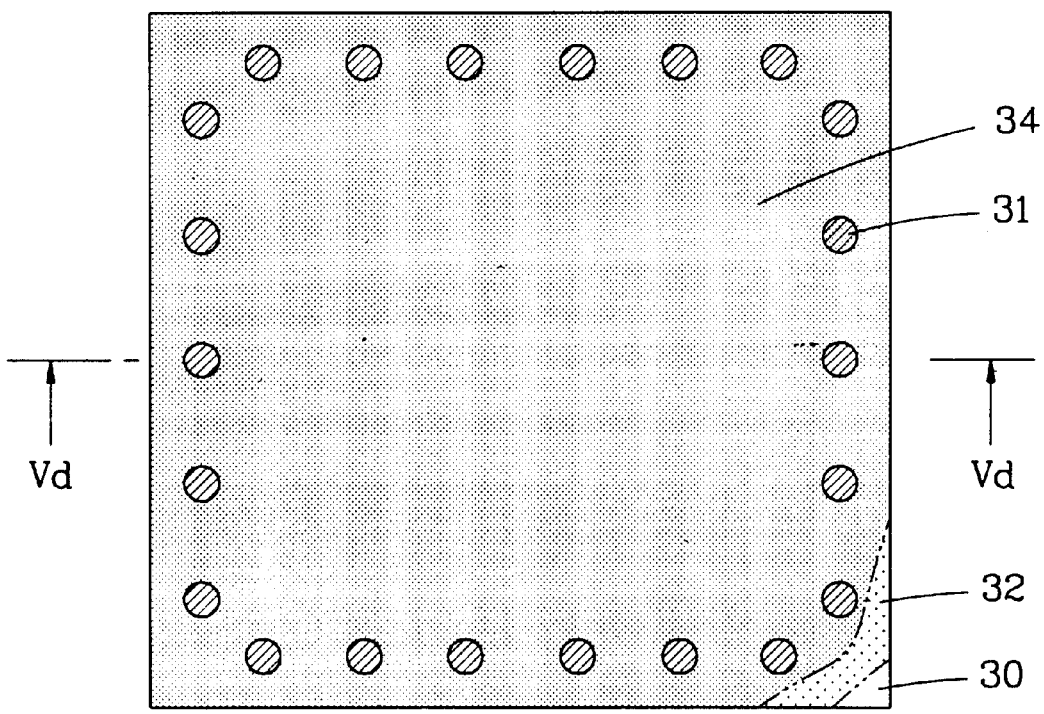
Figure 5D:
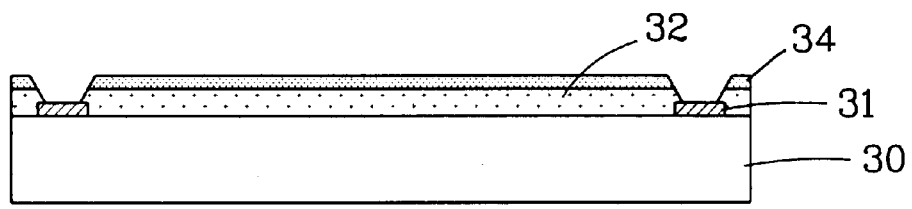

Thereafter, the low elastic modulus material layer 32, namely the silicone is spread at a thickness of 15 to 70 $\mu$m on the entire upper portion of the semiconductor chip 30 as shown in FIG. 5a. It is economically advantageous to employ as a spreading method a spin coating process or a sputtering process generally used for a thin film formation process in the semiconductor chip fabrication process. An elastic modulus of the silicone is between 3.5 MPa and 60 MPa. In addition to the silicone, an insulation material having an elastic modulus equal to or smaller than 400 MPa may be used as the low elastic modulus material layer 32. Thereafter, the high elastic modulus material layer having an elastic modulus between 1000 MPa and 8000 MPa, for example the polyimide or benzocyclo butene is formed at a thickness of 5 to 25 $\mu$m on the low elastic modulus material layer 32. The upper portions of the pads 31 are exposed by forming a photoresist pattern (not shown) on the high elastic modulus material layer 34, and by selectively etching it. As a result, the structure of FIG. 5c is formed. FIG. 5d is a vertical-sectional view taken along Line Vd—Vd in FIG. 5c. Reference numerals identical to FIG. 5c depict identical units.

Figure 5E:
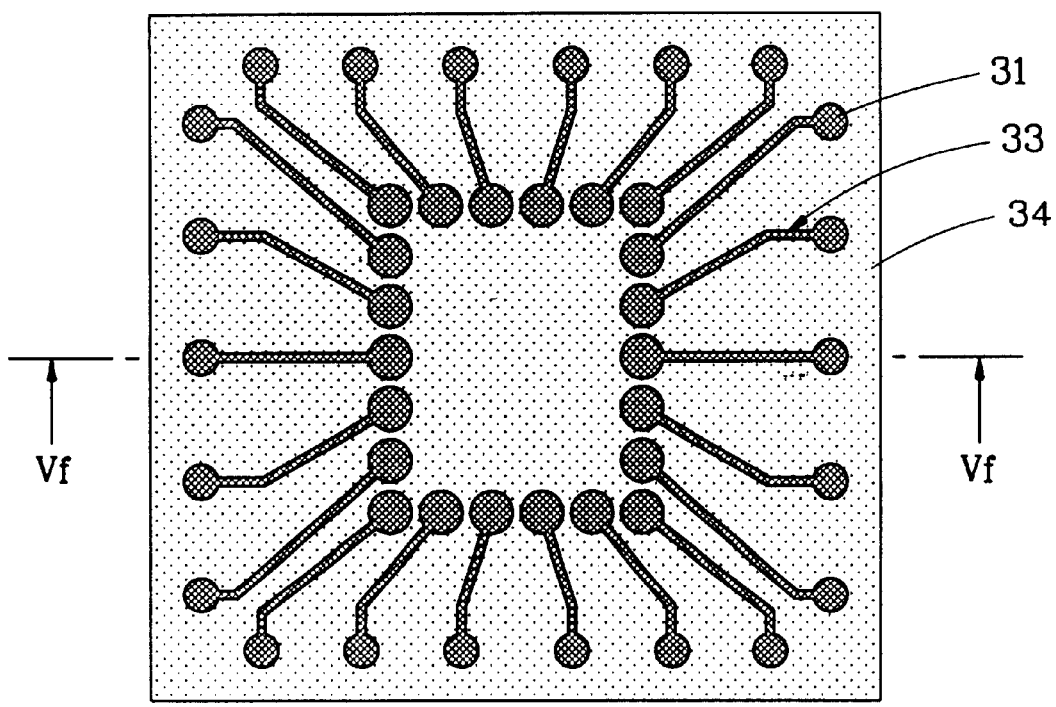

As shown in FIG. 5e, the metal film is formed on the pads 31 and the high elastic modulus material layer 34, and patterned, thereby forming the metal patterns 33.

Figure 5F:
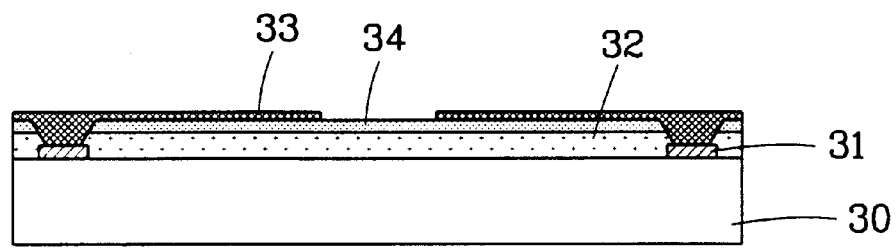

FIG. 5f is a vertical-sectional view taken along Line Vf—Vf in FIG. 5e. Reference numerals identical to FIG. 5e depict identical units.

The solder resist 35 is spread on the entire structure of FIG. 5e, and selectively etched so that the upper predetermined portion of the metal pattern 33 can be exposed. Screen-printing and reflowing of the solder is performed on the metal pattern 33, and the conductive ball 35 is bonded at the upper portion of the metal pattern, thereby making a structure of FIG. 5h. The conductive ball 37 is equivalent to the outer lead, and thus there can be employed different conductive media having electric conductivity, such as a spring lead, a bump and the like. The outer lead may be variously formed as described in the first embodiment of the present invention.

Figure 5G:
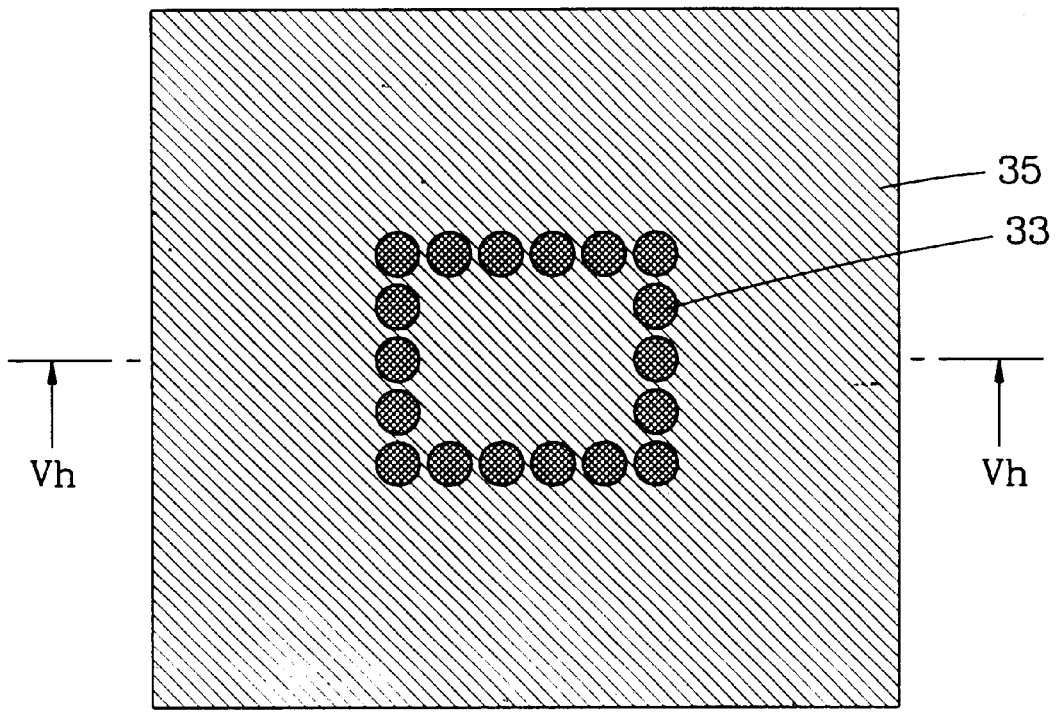
Figure 5H:
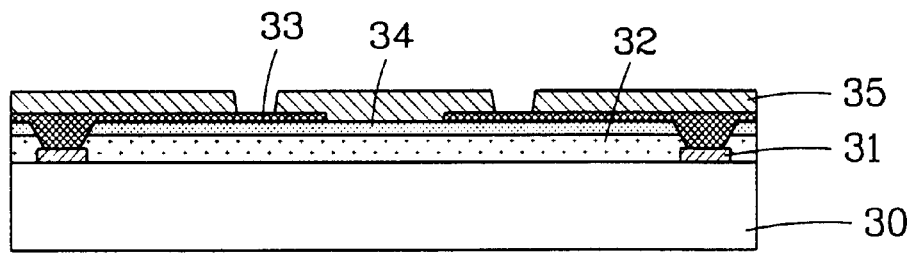
Figure 5I:
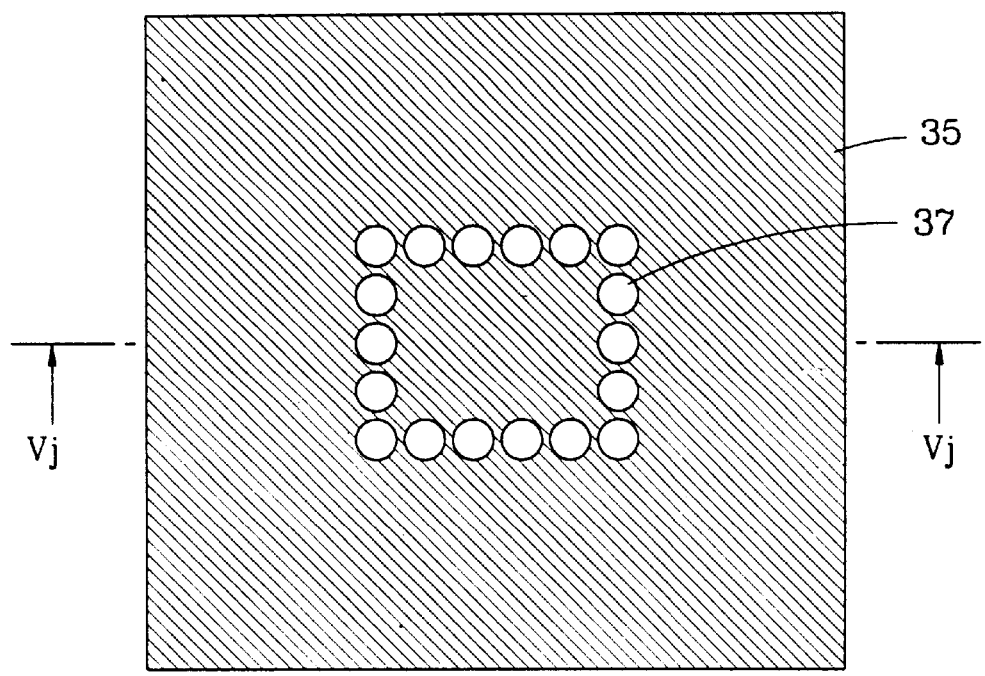

FIG. 5h is a vertical-sectional view taken along Line Vh—Vh in FIG. 5g. Reference numerals identical to FIG. 5g depict identical units.

Figure 5J:
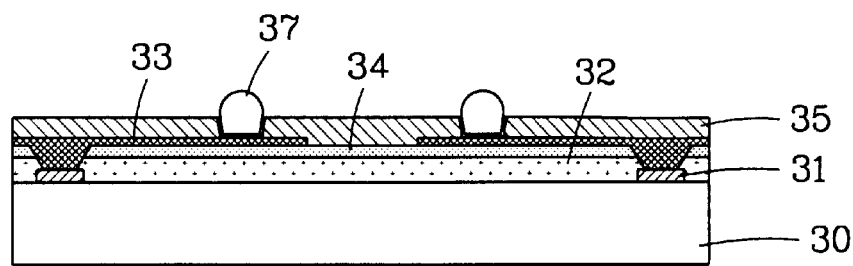

The fabrication process of the semiconductor chip package in accordance with the present invention as shown in FIGS. 5a to 5j is carried out at a wafer level. After the process of FIG. 5j is completed, the semiconductor chips on the wafer are respectively separated, thus completing the fabrication of the semiconductor chip package in accordance with the second embodiment of the present invention.

According to the present invention, the fabrication and package processes of the semiconductor chip are consecutively performed at the wafer level, and thus the fabrication time of the semiconductor chip package is reduced.

In addition, according to the present invention, the package is fabricated by employing the equipment used for the semiconductor chip fabrication process, and thus special equipment is not necessary. As a result, the equipment cost is reduced, and thus the fabrication cost of the semiconductor chip package is also decreased.

According to the present invention, a film-type polyimide tape having the metal patterns at its upper portion and a film-type elastomer are not required. Raw materials of the low or high elastic modulus material layer which are relatively cheaper than the completed film-type tape are used, and spread on the wafer, and thus the raw material cost is reduced, thereby decreasing the fabrication cost of the semiconductor chip package.

Also in accordance with the present invention, the lead is not formed by a method of bonding the metal patterns to the pads, but by a process of depositing the metal film on the pads and patterning it, thereby improving bonding reliability of the pads and leads.

According to the present invention, the low elastic modulus material layer is formed on the semiconductor chip having a high elastic modulus, and thus the stress generated due to the big difference in thermal expansion coefficient when the semiconductor chip package is mounted on the printed circuit board is absorbed by the low elastic modulus material layer. Consequently, reliability of the semiconductor chip package is improved.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A semiconductor chip package comprising:
   a semiconductor chip, a plurality of pads being formed at its upper portion;
   a low elastic modulus material layer covering the semiconductor chip except the pads, and having a relatively low elastic modulus;
   a plurality of metal patterns connected with at least one pad, and formed on an upper surface of the low elastic modulus material layer;
   a high elastic modulus material layer having an upper and lower portion, wherein the lower portion covers the metal patterns and the low elastic modulus material layer, wherein the upper portion has an opening portion for at least partially exposing the metal patterns, and wherein the high elastic modulus material layer has a relatively higher elastic modulus than the low elastic modulus material layer;
   a metal thin film lining the opening portion of the high elastic modulus material layer pattern and the at least partially exposed metal patterns; and
   electrically conductive media bonded to the metal thin film, wherein at least a portion of the electrically conductive media is within the opening portion of the high elastic modulus material layer pattern.

2. The package according to claim 1, wherein an elastic modulus of the low elastic modulus material layer is equal to or smaller than 400 MPa.

3. The package according to claim 1, wherein the elastic modulus of the low elastic modulus material layer is set between 3.5 MPa and 300 MPa.

4. The package according to claim 1, wherein a material of the low elastic modulus material layer is a silicone.

5. The package according to claim 1, wherein an elastic modulus of the high elastic modulus material layer is set between 1000 MPa and 8000 MPa.

6. The package according to claim 1, wherein the high elastic modulus material layer has a lower elastic modulus than a printed circuit board.

7. The package according to claim 1, wherein a material of the high elastic modulus material layer is polyimide or benzocyclo butene.

8. The package according to claim 1, wherein the electrically conductive media comprise conductive balls.

9. The package according to claim 1, wherein the electrically conductive media protrudes from the metal thin film to a height greater than the height of the high elastic modulus material layer.

10. The package according to claim 1, wherein the low elastic modulus material layer is directly in contact with the semiconductor chip.

11. The package according to claim 1, wherein a single upper surface of the low elastic modulus material layer is coplanar with both a bottom surface of at least one of the plurality of metal patterns and a lower surface of the high elastic modulus material layer.

12. A semiconductor chip package comprising:
   a semiconductor chip, a plurality of pads being formed at its upper portion;
   a low elastic modulus material layer covering the semiconductor chip except the pads, and having a relatively low elastic modulus;

a high elastic modulus material layer formed at an upper portion of the low elastic modulus material layer, and having a relatively higher elastic modulus than the low elastic modulus material layer;

a plurality of metal patterns connected with at least one pad, and formed on an upper portion of the high elastic modulus material layer; and electrically conductive media bonded to upper predetermined portions of the metal patterns.

13. The package according to claim 12, wherein a solder resist is spread on upper portions of the metal patterns.

14. The package according to claim 12, wherein the elastic modulus of the low elastic modulus material layer is equal to or smaller than 400 MPa.

15. The package according to claim 12, wherein the elastic modulus of the low elastic modulus material layer is set between 3.5 MPa and 300 MPa.

16. The package according to claim 12, wherein a material of the low elastic modulus material layer is a silicone.

17. The package according to claim 12, wherein an elastic modulus of the high elastic modulus material layer is set between 1000 MPa and 8000 MPa.

18. The package according to claim 12, wherein the high elastic modulus material layer has a lower elastic modulus than a printed circuit board.

19. The package according to claim 12, wherein a material layer of the high elastic modulus material layer is polyimide or benzocyclo butene.

20. The package according to claim 12, wherein the electrically conductive media comprise conductive balls.

21. A method for fabricating a semiconductor chip package, comprising:

fabricating a plurality of semiconductor chips having a plurality of pads at their upper portions on a semiconductor wafer;

covering a low elastic modulus material layer having a relatively low elastic modulus on the semiconductor wafer;

exposing the pads by selectively etching the low elastic modulus material layer;

covering a metal film on the low elastic modulus material layer and the exposed pads;

forming a plurality of metal patterns on the pads and the low elastic modulus material layer by selectively etching the metal film on the low elastic modulus material layer;

forming a high elastic modulus material layer having a relatively high elastic modulus on the metal patterns and the low elastic modulus material layer;

exposing upper predetermined portions of the metal patterns by selectively etching the high elastic modulus material layer to form an opening;

forming a thin metal film on the exposed upper portions of the metal patterns;

bonding electrically conductive media to the thin metal film, wherein at least a portion of the electrically conductive media is located in the opening in the high elastic modulus material layer; and cutting the semiconductor chips on the semiconductor wafer.

22. The method according to claim 21, wherein the forming of the low or high elastic modulus material layer is a spin coating process or a sputtering process.

23. The method according to claim 21, wherein covering the low elastic modulus material layer on the semiconductor wafer comprises covering silicone on the semiconductor wafer.

24. The method according to claim 21, wherein the forming of the high elastic modulus material layer on the metal patterns and the low elastic modulus material comprises forming polyimide or benzocyclo butene on the metal patterns and the low elastic modulus material.

25. The method according to claim 21, wherein the bonding of the electrically conductive media to the thin metal film comprises bonding conductive balls to the thin metal film.

26. The method to claim 21, wherein an elastic modulus of the low elastic modulus material layer is set between 3.5 MPa and 300 MPa, and an elastic modulus of the high elastic modulus material layer is set between 1000 MPa and 8000 MPa.

27. The method according to claim 21, wherein the high elastic modulus material layer is formed such that it has a lower elastic modulus than a printed circuit board.

28. The method according to claim 21, wherein bonding the electrically conductive media to the thin metal film comprises bonding an electrically conductive media with a height greater than a height of the high elastic modulus material layer.

29. The method according to claim 21, wherein the covering the low elastic modulus material layer on the semiconductor wafer comprises forming the low elastic modulus material layer directly on an upper surface of the semiconductor wafer.

30. The method according to claim 21, wherein covering the metal film on the low elastic modulus material layer occurs in part on a flat surface of the low elastic modulus material layer and the forming of the high elastic modulus material layer on the low elastic modulus material layer occurs in part on an adjacent portion of the flat surface of the low elastic modulus material layer.

31. A method for fabricating a semiconductor chip package, comprising:

fabricating a plurality of semiconductor chips having a plurality of pads at their upper portions on a semiconductor wafer;

covering a low elastic modulus material layer having a relatively low elastic modulus on the semiconductor wafer;

covering a high elastic modulus material layer having a relative high elastic modulus on an upper portion of the low elastic modulus material layer;

exposing the pads by selectively etching the high and low elastic modulus material layers;

covering a metal film on an upper portion of the high elastic modulus material layer and the exposed pads;

forming a plurality of metal patterns on the exposed pads and the upper portion of the high elastic modulus material layer by selectively etching the metal film on the upper portion of the high elastic modulus material layer;

bonding electrically conductive media to upper predetermined portions of the metal patterns; and cutting the semiconductor chips on the semiconductor water.

32. The method according to claim 31, wherein the forming of the low or high elastic modulus material layer is a spin coating process or a sputtering process.

33. The method according to claim 31, wherein covering the low elastic modulus material layer on the semiconductor wafer comprises covering silicone on the semiconductor wafer.

34. The method according to claim 31, wherein the forming of the high elastic modulus material layer on the metal patterns and the low elastic modulus material comprises forming polyimide or benzocyclo butene on the metal patterns and the low elastic modulus material.

35. The method according to claim 31, wherein the bonding of the electrically conductive media to the thin metal film comprises bonding conductive balls to the thin metal film.

36. The method according to claim 31, wherein an elastic modulus of the low elastic modulus material layer is set between 3.5 MPa and 300 MPa, and an elastic modulus of the high elastic modulus material layer is set between 1000 MPa and 8000 MPa.

37. The method according to claim 31, wherein the high elastic modulus material layer is formed such that it has a lower elastic modulus than a printed circuit board.

\* \* \* \* \*